(12) United States Patent
Priewasser et al.

(10) Patent No.: US 10,475,676 B2
(45) Date of Patent: Nov. 12, 2019

(54) WORKPIECE PROCESSING METHOD

(71) Applicant: DISCO CORPORATION, Tokyo (JP)

(72) Inventors: Karl Heinz Priewasser, Munich (DE); Akiko Kigawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/986,998

(22) Filed: May 23, 2018

(65) Prior Publication Data

US 2018/0342408 A1    Nov. 29, 2018

(30) Foreign Application Priority Data

May 23, 2017  (JP) ................. 2017-101598

(51) Int. Cl.
*H01L 21/67*  (2006.01)
*H01L 21/683*  (2006.01)
*B32B 43/00*  (2006.01)

(52) U.S. Cl.
CPC ...... *H01L 21/67132* (2013.01); *B32B 43/006* (2013.01); *H01L 21/67092* (2013.01);
(Continued)

(58) Field of Classification Search
USPC ....... 156/153, 160, 229, 247, 248, 250, 267, 156/701, 714, 716
See application file for complete search history.

(56) References Cited

U.S. PATENT DOCUMENTS 5,882,956 A * 3/1999 Umehara ............ H01L 21/304
438/114
6,478,918 B2 * 11/2002 Bennett ............ H01L 21/6836
156/247
(Continued)

FOREIGN PATENT DOCUMENTS

JP     2002192370 A      10/2002
JP     2007123658 A  *  5/2007
(Continued)

OTHER PUBLICATIONS

English Abstract of JP 2011-077482 (Year: 2019).*
English Abstract for JP 2007-123658 (Year: 2019).*
English Abstract for JP 2014-143297 (Year: 2019).*

*Primary Examiner* — Sing P Chan
(74) *Attorney, Agent, or Firm* — Greer, Burns & Crain, Ltd.

(57) ABSTRACT

In a processing method, a surface protective tape peeling step of peeling a surface protective tape off the top surface of a wafer is performed in a state in which an expanding sheet is expanded while a preliminary expanding step of expanding the expanding sheet is performed after an affixing step is performed. Therefore, the surface protective tape can be peeled off the top surface of the wafer while a tension is applied to the expanding sheet. It is thereby possible to prevent chips from coming into contact with each other and being damaged. When an expanding step is thereafter performed, the expanding sheet is expanded by an amount of expansion which amount is a value larger than an amount of expansion of the expanding sheet in the preliminary expanding step. Thus, sufficient intervals can be formed between the chips, and the chips can be transported smoothly.

3 Claims, 13 Drawing Sheets

(52) U.S. Cl.
CPC ...... *H01L 21/6836* (2013.01); *B32B 2457/14* (2013.01); *H01L 2221/68327* (2013.01); *H01L 2221/68386* (2013.01)

(56) References Cited

U.S. PATENT DOCUMENTS

| | | | | | |
|---|---|---|---|---|---|
| 6,589,809 | B1 * | 7/2003 | Koopmans | ........ | H01L 21/67121 |
| | | | | | 438/113 |
| 6,908,784 | B1 * | 6/2005 | Farnworth | .......... | H01L 21/3043 |
| | | | | | 438/106 |
| 6,943,094 | B2 * | 9/2005 | Koopmans | ........ | H01L 21/67121 |
| | | | | | 438/462 |
| 7,051,428 | B2 * | 5/2006 | Jeong | ................ | H01L 21/67132 |
| | | | | | 29/729 |
| 7,265,035 | B2 * | 9/2007 | Honma | ............. | H01L 21/67132 |
| | | | | | 257/E21.484 |
| 7,410,831 | B2 * | 8/2008 | Sakaya | ................ | B28D 5/0011 |
| | | | | | 438/113 |
| 7,563,642 | B2 * | 7/2009 | Higashino | ......... | H01L 21/67132 |
| | | | | | 438/113 |
| 9,905,453 | B2 * | 2/2018 | Priewasser | ............... | H01L 21/78 |
| 9,935,010 | B2 * | 4/2018 | Priewasser | ........... | B23K 26/364 |
| 10,242,913 | B2 * | 3/2019 | Priewasser | ........... | H01L 21/6836 |
| 2007/0026572 | A1 * | 2/2007 | Hatakeyama | ............... | C09J 7/35 |
| | | | | | 438/113 |
| 2007/0218651 | A1 * | 9/2007 | Higashino | ......... | H01L 21/67132 |
| | | | | | 438/460 |
| 2017/0365519 | A1 * | 12/2017 | Priewasser | ........... | B23K 26/364 |
| 2018/0005862 | A1 * | 1/2018 | Priewasser | .............. | H01L 21/78 |
| 2018/0204771 | A1 * | 7/2018 | Morikazu | .......... | B23K 26/0622 |
| 2018/0211877 | A1 * | 7/2018 | Priewasser | ........... | H01L 21/6836 |

FOREIGN PATENT DOCUMENTS

| | | | |
|---|---|---|---|
| JP | 2011077482 A | * | 4/2011 |
| JP | 2011077482 A | | 4/2011 |
| JP | 2014143297 A | * | 8/2014 |
| WO | 2003077295 A1 | | 9/2003 |

* cited by examiner

WORKPIECE PROCESSING METHOD

BACKGROUND OF THE INVENTION

Field of the Invention

The present invention relates to a method of processing a workpiece having division starting points formed along a plurality of intersecting planned dividing lines, and having a surface protective tape affixed to a top surface of the workpiece, or a workpiece divided into individual chips along a plurality of intersecting planned dividing lines, and having a surface protective tape affixed to a top surface of the workpiece.

Description of the Related Art

A workpiece such as a wafer or the like has devices individually formed in regions demarcated by planned dividing lines in the form of a lattice in a top surface of the workpiece. The workpiece is divided into individual device chips having the devices by dividing the workpiece along the planned dividing lines. Adopted as a method of dividing the workpiece into individual device chips is a method of dividing the workpiece by applying an external force to the workpiece after a modified layer is formed within the workpiece by irradiating the workpiece with a laser beam of a wavelength capable of passing through the workpiece (see Japanese Patent No. 3408805, for example). An expanding apparatus illustrated in Japanese Patent Laid-Open No. 2011-77482, for example, is used as an example of an apparatus that applies the external force to the workpiece.

On the other hand, a method is also proposed which thins the workpiece by grinding and polishing after forming the modified layer within the workpiece toy applying the laser beam in the above-described method, and divides the workpiece in this thinning step (see Japanese Patent No. 3762409, for example). The workpiece divided by the dividing method has no gaps between the divided chips, and the divided chips are in close contact with each other. Therefore, adjacent chips may come into contact with each other and be damaged when the workpiece is handled. Accordingly, the expanding apparatus as described above is used to form intervals between adjacent chips by expanding a sheet to which the workpiece is affixed.

SUMMARY OF THE INVENTION

When a surface protective tape is peeled off a workpiece having division starting points formed therein, a force in a peeling direction is applied to the workpiece, so that the workpiece may be broken into individual chips and the chips may come into contact with each other and be damaged. A similar problem occurs also in a divided workpiece. The chips do not come into contact with each other if the workpiece is firmly fixed when the surface protective tape is peeled off. However, it is difficult to fix the workpiece firmly because the workpiece is held via an expandable flexible sheet at the time of peeling off the surface protective tape. This problem occurs more noticeably when chip size is decreased.

It is accordingly an object of the present invention to provide a workpiece processing method that can prevent damage to chips.

In accordance with an aspect of the present invention, there is provided a workpiece processing method of processing a workpiece having division starting points formed within the workpiece along a plurality of intersecting planned dividing lines, and having a surface protective tape affixed to a top surface of the workpiece, or a workpiece divided into individual chips along a plurality of intersecting planned dividing lines, and having a surface protective tape affixed to a top surface of the workpiece, the workpiece processing method including: an affixing step of affixing an undersurface side of the workpiece onto an expanding sheet having a larger size than the workpiece; a preliminary expanding step of expanding the expanding sheet after performing the affixing step; a surface protective tape peeling step of peeling the surface protective tape off the top surface of the workpiece in a state in which the expanding sheet is expanded while the preliminary expanding step is performed; and an expanding step of expanding the expanding sheet by an amount of expansion, the amount of expansion being a value larger than an amount of expansion of the expanding sheet in the preliminary expanding step, after performing the surface protective tape peeling step.

Preferably, the workpiece processing method further includes a sandwiching step of sandwiching the expanding sheet by a pair of first sandwiching means opposed to each other with the workpiece interposed between the pair of the first sandwiching means in a first direction and sandwiching the expanding sheet by a pair of second sandwiching means opposed to each other with the workpiece interposed between the pair of the second sandwiching means in a second direction orthogonal to the first direction, in which the preliminary expanding step and the expanding step expand the expanding sheet by moving the pair of the first sandwiching means such that the pair of the first sandwiching means is separated from each other, and moving the pair of the second sandwiching means such that the pair of the second sandwiching means is separated from each other.

Preferably, in the surface protective tape peeling step, a peeling direction of peeling off the surface protective tape is set to be a direction different from an extending direction of the planned dividing lines.

According to the present invention, the surface protective tape can be peeled off the top surface of the wafer while a tension is applied to the expanding sheet. It is thereby possible to prevent chips from coming into contact with each other and being damaged. When the expanding step is thereafter performed, the expanding sheet is expanded by an amount of expansion which amount is a value larger than that at the time of the preliminary expanding step. Thus, sufficient intervals can be formed between chips, and the chips can be transported smoothly.

In addition, in the preliminary expanding step and the expanding step, the expanding sheet is expanded by moving the pair of first sandwiching means such that the pair of first sandwiching means is separated from each other, and moving the pair of second sandwiching means such that the pair of second sandwiching means is separated from each other. The expanding sheet can therefore be expanded sufficiently.

Further, when the surface protective tape peeling step is performed, the peeling direction of peeling off the surface protective tape is set to be a direction different from the extending direction of the planned dividing lines. Thus, the surface protective tape can be peeled off efficiently without a force at the time of peeling the surface protective tape off the top surface of the wafer greatly acting in the extending direction of the planned dividing lines, and the chips can be prevented from coming into contact with each other and being damaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1 Expanding Apparatus

Figure 1:
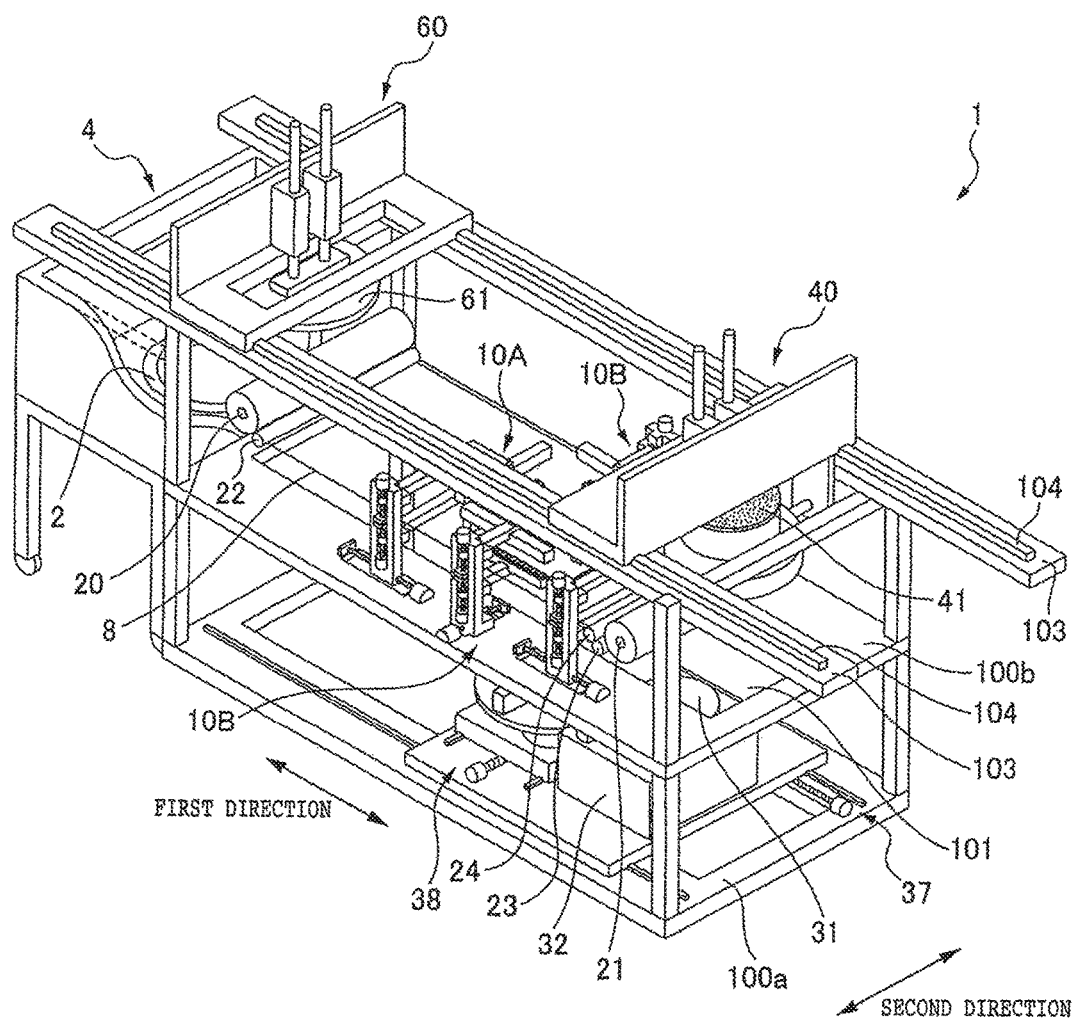
FIG. 1 is a perspective view depicting a configuration of an expanding apparatus.

An expanding apparatus 1 depicted in FIG. 1 is an example of an expanding apparatus capable of expanding an expanding sheet 8 affixed to a workpiece. The expanding apparatus 1 is of a three-layer structure. The expanding apparatus 1 includes: an apparatus base 100a extending in a first direction in a first layer part; an apparatus base 100b extending in the first direction in a second layer part; and a pair of guide bases 103 extending in the first direction in a third layer part. An opening 101 for communicating with the apparatus base 100a side is formed in a central part of the apparatus base 100b. Guide rails 104 extending in the first direction are laid on the pair of guide bases 103, individually. An annular frame supply unit 4 for housing a plurality of annular frames 2 having an opening 3 depicted in FIG. 2 in a center thereof is coupled to rearward sides in the first direction of the apparatus bases 100a and 100b.

Figure 2:
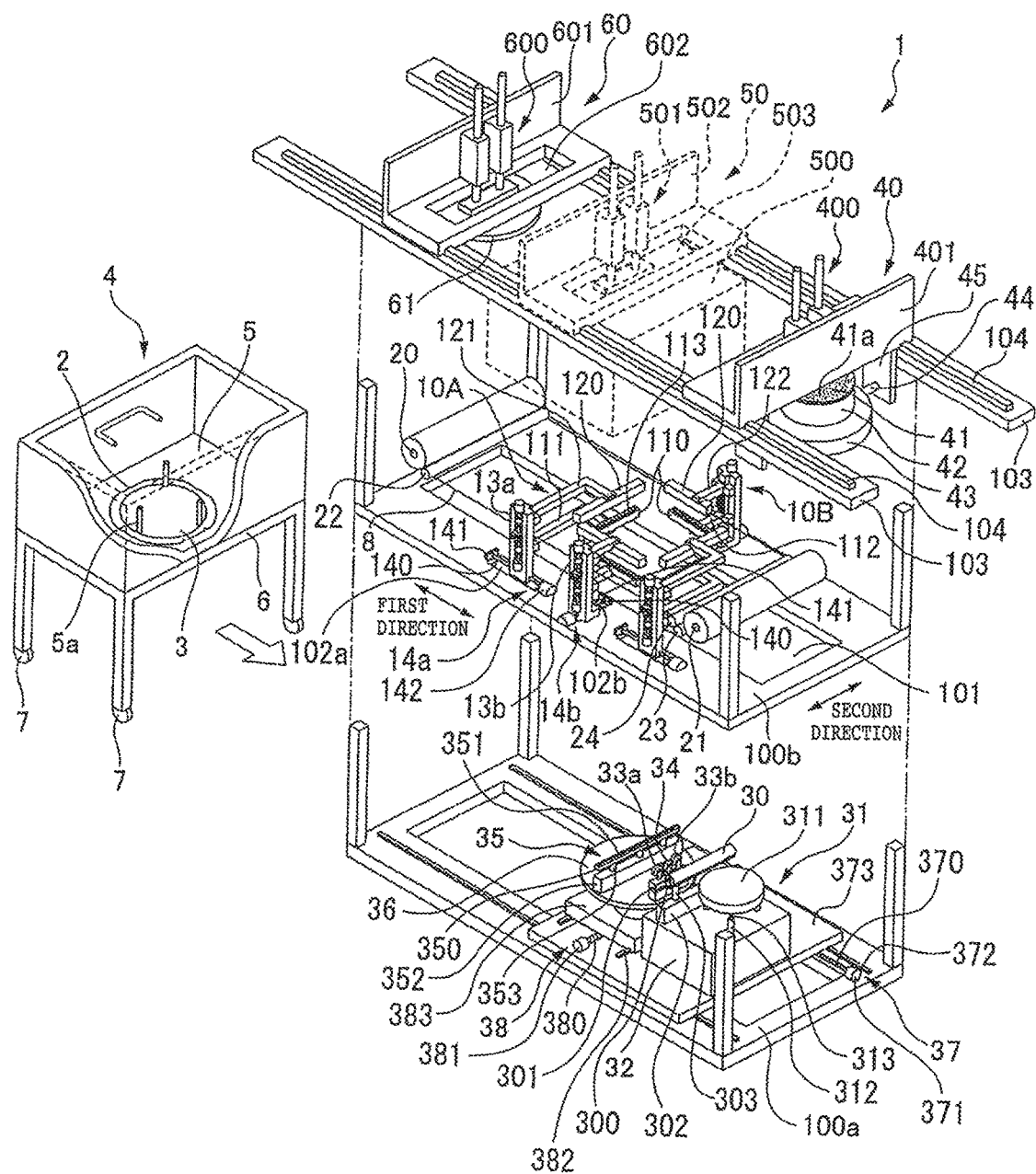
FIG. 2 is an exploded perspective view depicting the configuration of the expanding apparatus.

The expanding apparatus 1 depicted in FIG. 2 represents a state before each layer is coupled, and represents a state before the annular frame supply unit 4 is coupled to the apparatus bases 100a and 100b. The annular frame supply unit 4 includes, for example, a box-shaped frame stocker 5 for stocking the annular frames 2 in a stacked manner. A plurality of cylindrical members 5a (three cylindrical members 5a in the example of FIG. 2) in contact with inner circumferential surfaces of the annular frames 2 are erected at substantially equal intervals within the frame stocker 5. A carriage 6 to which a plurality of casters 7 are attached is coupled to the frame stocker 5. The carriage 6 can be moved by driving the casters 7 with the man power of a worker as a power source, for example.

The apparatus base 100b is provided with: a feeding reel 20 that feeds the expanding sheet 8 wound in a roll shape; a winding reel 21 that winds the fed expanding sheet 8; and expanding means for expanding the expanding sheet 8 between the feeding reel 20 and the winding reel 21. The expanding means includes: a pair of first sandwiching means 10A that are opposed to each other in the first direction, and between which the workpiece affixed to the expanding sheet 8 is interposed; and a pair of second sandwiching means 10B that are opposed to each other in a second direction orthogonal to the first direction, and between which the workpiece is interposed. The pair of guide bases 103 includes holding means 40 for holding the workpiece, a peeling unit 50 that peels off a surface protective tape affixed to the workpiece, and frame holding means 60 for holding the annular frame 2. The apparatus base 100a is provided with: an affixing roller 30 that is disposed on the downward side of the expanding sheet 8 expanded by the expanding means, and affixes the expanding sheet 8 to the workpiece held by the holding means 40; releasing means 31 for holding the workpiece via the expanding sheet 8 expanded by the expanding means; frame affixing rollers 33a and 33b that are disposed on the downward side of the expanding sheet 8 to which the workpiece is affixed, and affixes the expanding sheet 8 to an annular frame 2 held by the frame holding means 60; cutting means 34 that is disposed on the downward side of the expanding sheet 8 to which the workpiece is affixed, and cuts the expanding sheet 8 along the annular frame 2 held by the frame holding means 60; and dividing means 35 for dividing the workpiece into individual chips by applying an external force to the workpiece.

In the first layer depicted in FIG. 2, the affixing roller 30, the releasing means 31, the frame affixing rollers 33*a* and 33*b*, the cutting means 34, and the dividing means 35 are arranged so as to be movable in the first direction by first direction feeding means 37 on the apparatus base 100*a*. The first direction feeding means 37 includes: a ball screw 370 extending in the first direction; a motor 371 connected to an end portion of the ball screw 370; a pair of guide rails 372 extending in parallel with the ball screw 370; and a movable base 373 horizontally movable in the first direction. A fixed base 32 and second direction feeding means 38 are arranged on the movable base 373. One surface of the movable base 373 is in sliding contact with the pair of guide rails 372. The ball screw 370 is screwed into a nut formed on the movable base 373. When the ball screw 370 is rotated by being driven by the motor 371, the movable base 373 is moved in the first direction while guided by the guide rails 372, and is thus able to move the affixing roller 30, the releasing means 31, the frame affixing rollers 33*a* and 33*b*, the cutting means 34, and the dividing means 35 in the first direction.

The frame affixing rollers 33*a* and 33*b*, the cutting means 34, and the dividing means 35 are disposed so as to be further movable in the second direction by the second direction feeding means 38 on the movable base 373. The second direction feeding means 38 includes: a ball screw 380 extending in the second direction; a motor 381 connected to an end portion of the ball screw 380; a pair of guide rails 382 extending in parallel with the ball screw 380; and a movable base 383 horizontally movable in the second direction. A rotary table 36 is disposed on the movable base 383. One surface of the movable base 383 is in sliding contact with the pair of guide rails 382. The ball screw 380 is screwed into a nut formed on a central portion of the movable base 383. When the ball screw 380 is rotated by being driven by the motor 381, the movable base 383 is moved in the second direction while guided by the guide rails 382, and is thus able to move the frame affixing rollers 33*a* and 33*b*, the cutting means 34, and the dividing means 35 in the second direction.

The affixing roller 30 is provided to an upper surface of the fixed base 32 fixed on the movable base 373. The affixing roller 30 extends in the second direction orthogonal to the first direction. The affixing roller 30 is supported by a supporting portion 300 so as to be rotatable about a shaft portion 301 having an axis in the second direction. In addition, the affixing roller 30 can be raised and lowered by a raising and lowering mechanism formed by an air cylinder 302 and a piston 303, for example.

The releasing means 31 is disposed in the vicinity of the affixing roller 30 and on the upper surface of the fixed base 32. The releasing means 31 includes a releasing table 311 that sucks and holds the workpiece. The releasing table 311 is connected with a suction source, which is not depicted, so that the releasing table 311 can suck and hold the workpiece on an upper surface of the releasing table 311. A raising and lowering mechanism formed by an air cylinder 312 and a piston 313, for example, is connected to a lower portion of the releasing table 311, so that the raising and lowering mechanism can raise and lower the releasing table 311.

The frame affixing rollers 33*a* and 33*b* are pressing rollers that press the expanding sheet 8 against the annular frame 2, and are rotatable about a shaft portion. The cutting means 34 is disposed between the frame affixing rollers 33*a* and 33*b*. The cutting means 34 is, for example, a cutter, and is rotatable about a shaft portion. The frame affixing rollers 33*a* and 33*b* and the cutting means 34 can be raised and lowered by a raising and lowering mechanism formed by an air cylinder and a piston, for example. The frame affixing rollers 33*a* and 33*b* and the cutting means 34 are disposed on the rotary table 36. The frame affixing rollers 33*a* and 33*b* and the cutting means 34 can be made to go around along the annular frame 2, for example, by rotating the rotary table 36. Incidentally, the number of frame affixing rollers 33*a* and 33*b* and cutting means 34 is not limited to that of the configuration depicted in the present embodiment.

The dividing means 35 includes a squeegee 350 that is provided to a central portion of the rotary table 36, and which extends in the second direction orthogonal to the first direction. A slit 351 connected to a suction source is formed in the squeegee 350. The squeegee 350 can be raised and lowered by a raising and lowering mechanism formed by an air cylinder 352 and a piston 353, for example. When the rotary table 36 rotates by 90 degrees, for example, the extending direction of the squeegee 350 can be aligned with each of planned dividing lines of the workpiece which planned dividing lines are oriented in the first direction and planned dividing lines of the workpiece which planned dividing lines are oriented in the second direction. The dividing means 35 can divide the workpiece into individual chips by sucking the planned dividing lines of the workpiece by the squeegee 350 through the slit 351.

A configuration of the second layer will next be described. The feeding reel 20 is disposed on the rearward side in the first direction of the apparatus base 100*b*. The winding reel 21 is disposed on the forward side in the first direction of the apparatus base 100*b*. The feeding reel 20 is wound with the expanding sheet 8 in a roll shape. A feeding roller 22 that feeds the expanding sheet 8 in the first direction from the feeding reel 20 is disposed on the downward side of the feeding reel 20. The winding reel 21 is wound with the expanding sheet 8 in a roll shape, the expanding sheet 8 being fed from the feeding reel 20. Disposed below the winding reel 21 are drawing-in rollers 23 and 24 that draw in the expanding sheet 8 fed in the first direction by the feeding roller 22 to make the winding reel 21 wind the expanding sheet 8.

The pair of first sandwiching means 10A each includes: a rectangular parallelepipedic lower side sandwiching portion 110 extending in the second direction; an arm portion 111 having a substantially L-shaped section, the arm portion 111 having one end coupled to the lower side sandwiching portion 110; an upper side sandwiching portion 120 extending in parallel with the lower side sandwiching portion 110; an arm portion 121 having a substantially L-shaped section, the arm portion 121 having one end coupled to the upper side sandwiching portion 120; a movable base 13*a* disposed so as to be movable along a recessed portion 102*a* formed in an upper surface of the apparatus base 100*b*; and first direction moving means 14*a* for moving the pair of first sandwiching means 10A in directions of separating the pair of first sandwiching means 10A from each other in the first direction. A plurality of rollers 113 are disposed so as to be aligned in a direction parallel with the second direction on an upper surface side of the lower side sandwiching portion 110. The plurality of rollers 113 are rotatable about a rotation axis parallel with the first direction. The plurality of rollers 113 are fitted in a state in which approximately half of an outer circumferential surface of each of the plurality of rollers 113 projects from the upper surface of the lower side sandwiching portion 110. In addition, a plurality of rollers (not depicted) are disposed on a lower surface side of the upper side sandwiching portion 120 of each of the first sandwiching means 10A so as to be aligned in a direction parallel with the second direction. The plurality of rollers disposed on the lower surface side of the upper side sandwiching portion 120 are rotatable about a rotation axis parallel with the first direction, and are fitted in a state in which approximately half of an outer circumferential surface of each of the plurality of rollers projects from the lower surface of the upper side sandwiching portion 120.

The pair of second sandwiching means 10B each includes: a rectangular parallelepipedic lower side sandwiching portion 110 extending in the first direction; an arm portion 112 that has an end portion coupled to the lower side sandwiching portion 110, and extends in the second direction; an upper side sandwiching portion 120 extending in parallel with the lower side sandwiching portion 110; an arm portion 122 that has one end coupled to the upper side sandwiching portion 120, and extends in parallel with the arm portion 112; a movable base 13b disposed so as to be movable along a recessed portion 102b formed in the upper surface of the apparatus base 100b; and second direction moving means 14b for moving the pair of second sandwiching means 10B in directions of separating the pair of second sandwiching means 10B from each other in the second direction. A plurality of rollers 113 are disposed so as to be aligned in a direction parallel with the first direction on an upper surface side of the lower side sandwiching portion 110. The plurality of rollers 113 are rotatable about a rotation axis parallel with the second direction. The plurality of rollers 113 are fitted in a state in which approximately half of an outer circumferential surface of each of the plurality of rollers 113 projects from the upper surface of the lower side sandwiching portion 110. In addition, a plurality of rollers (not depicted) are disposed on a lower surface side of the upper side sandwiching portion 120 of each of the second sandwiching means 10B so as to be aligned in a direction parallel with the first direction. The plurality of rollers disposed on the lower surface side of the upper side sandwiching portion 120 are rotatable about a rotation axis parallel with the second direction, and are fitted in a state in which approximately half of an outer circumferential surface of each of the plurality of rollers projects from the lower surface of the upper side sandwiching portion 120.

The first direction moving means 14a includes: a ball screw 140 extending in the first direction; a bearing portion 141 rotatably supporting one end of the ball screw 140; and a motor 142 connected to another end of the ball screw 140; the ball screw 140, the bearing portion 141, and the motor 142 being individually provided to the apparatus base 100b. The second direction moving means 14b includes: a ball screw 140 extending in the second direction; a bearing portion 141 rotatably supporting one end of the ball screw 140; and a motor 142 connected to another end of the ball screw 140; the ball screw 140, the bearing portion 141, and the motor 142 being individually provided to the apparatus base 100b.

A configuration of the third layer will next be described. The frame holding means 60 is disposed on the rearward side in the first direction of the pair of guide bases 103. The frame holding means 60 includes a frame holding portion 61 in a shape of a circular plate, the frame holding portion 61 holding an annular frame 2. A raising and lowering portion 600 that vertically raises and lowers the whole of the frame holding portion 61 is connected to the frame holding portion 61. The raising and lowering portion 600 is a raising and lowering mechanism having an air cylinder and a piston, or a motor and a guide rail, for example. The raising and lowering portion 600 is connected to a running portion 601 having a substantially L-shaped section. An opening 602 is formed in the running portion 601. The raising and lowering portion 600 vertically moves in such an opening 602 to raise and lower the frame holding portion 61. The running portion 601 can run in the first direction along the pair of guide rails 104. The frame holding means 60 can move to the upward side of the annular frame supply unit 4, enter the inside of the frame stocker 5, and carry out and carry in an annular frame 2.

The holding means 40 is disposed on the forward side in the first direction of the pair of guide bases 103. The holding means 40 includes: a holding table 41 that has a holding surface 41a for holding the workpiece; a rotary table 42 that rotates the holding table 41; a base 43 that supports the holding table 41 and the rotary table 42 from below; a rotary shaft 44 that is passed through the base 43, and inverts the holding surface 41a of the holding table 41; and a gate type supporting portion 45 that rotatably supports end portions of the rotary shaft 44. A raising and lowering portion 400 is connected to the supporting portion 45. The raising and lowering portion 400 is a raising and lowering mechanism having an air cylinder and a piston, or a motor and a guide rail, for example. The raising and lowering portion 400 is connected to a running portion 401 having a substantially L-shaped section. Though not depicted, an opening is formed in the running portion 401. The raising and lowering portion 400 can vertically move in such an opening to raise and lower the holding table 41.

The peeling unit 50 is disposed between the holding means 40 and the frame holding means 60. The peeling unit 50 is a tape peeling unit for peeling off the surface protective tape affixed to the workpiece. The peeling unit 50 includes: tape holding means 50A depicted in FIG. 3A for holding the surface protective tape; bending roller moving means 50B depicted in FIG. 3B for bending the surface protective tape peeled off the workpiece; and peeling starting point portion forming means 50C depicted in FIG. 3C for forming a peeling starting point of the surface protective tape peeled off the workpiece. The three means are housed in a frame body 500, for example. The downward side of the frame body 500 is opened. A raising and lowering portion 501 is connected to the frame body 500. The raising and lowering portion 501 is a raising and lowering mechanism having an air cylinder and a piston, or a motor and a guide rail, for example. The raising and lowering portion 501 is connected to a running portion 502 having a substantially L-shaped section. An opening 503 is formed in the running portion 502. In such an opening 503, the raising and lowering portion 501 can raise and lower the whole of the frame body 500.

Figure 3A:
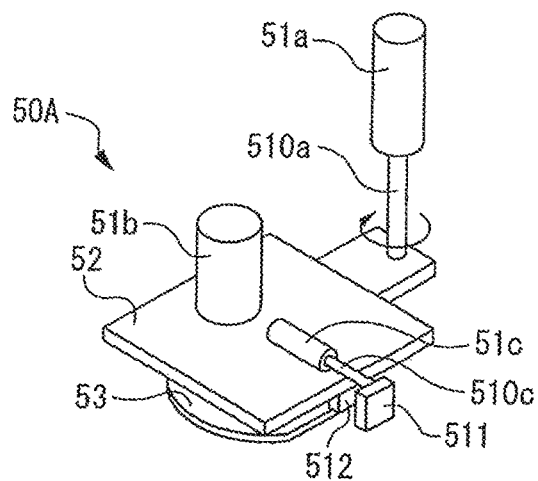
FIG. 3A is a perspective view depicting a configuration of tape holding means of a peeling unit.

As depicted in FIG. 3A, the tape holding means 50A includes: a first air cylinder 51a; a holding base 52 supported by a shaft 510a that is driven by the first air cylinder 51a and extends in a vertical direction; a second air cylinder 51b erected on an upper surface of the holding base 52; a holding plate 53 supported by a shaft (not depicted) that penetrates from the second air cylinder 51b to a lower surface side of the holding base 52 and is capable of advancing and retreating by being driven by the second air cylinder 51b; a third air cylinder 51c that is disposed on the holding base 52, and horizontally advances and retreats a shaft 510c having a sandwiching piece 511 at an end portion thereof and capable of advancing and retreating in a horizontal direction; and an sandwiching piece 512 disposed on the lower surface: side of the holding base 52 and at a position opposed to the sandwiching piece 511.

The holding plate 53 has an inside formed so as to be hollow. A large number of fine pores not depicted are provided in an entire lower surface of the holding plate 53. The inside of the holding plate 53 can be sucked via the inside of the shaft coupling the second air cylinder 51b and the holding plate 53 to each other, and a negative pressure can be generated on the lower surface of the holding plate 53 via the fine pores.

The holding base 52 is configured to be able to move vertically together with the shaft 510a, which is driven by the first air cylinder 51a so as to be able to advance and retreat. The holding base 52 is further rotatable in the horizontal direction about the shaft 510a, as indicated by an arrow in FIG. 3A.

Figure 3B:
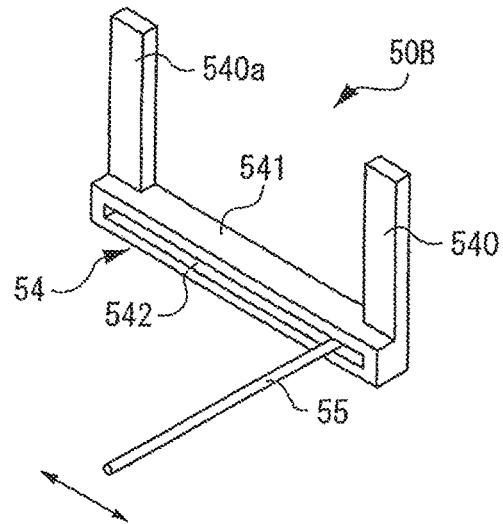
FIG. 3B is a perspective view depicting a configuration of bending roller moving means of the peeling unit.

As depicted in FIG. 3B, the bending roller moving means 50B is formed by a supporting frame 54 having a gate shape. The supporting frame 54 includes: column portions 540 and 540a arranged side by side at an interval from each other; a supporting portion 541 coupled to lower ends of the column portions 540 and 540a; and a bending roller 55 moved along a guiding hole 542 of the supporting portion 541 by a driving mechanism (not depicted) included within the supporting portion 541. The bending roller 55 is rotatable about an axial center in a longitudinal direction. The length of the bending roller 55 is at least longer than the diameter of the protective tape affixed to the workpiece.

Figure 3C:
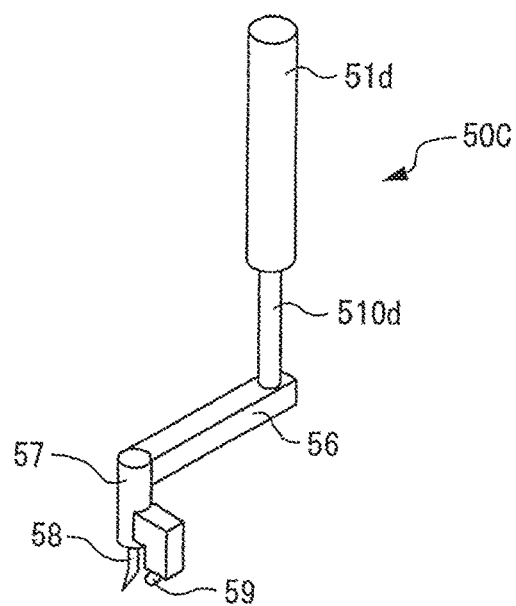
FIG. 3C is a perspective view depicting a configuration of peeling starting point portion forming means of the peeling unit.

As depicted in FIG. 3C, the peeling starting point portion forming means 50C includes: a fourth air cylinder 51d; a shaft 510d that extends from the fourth air cylinder 51d and is capable of advancing and retreating, and whose position in a height direction can be finely adjusted; an arm member 56; an end member 57 provided to an end of the arm member 56; an end needle-shaped member 58 attached to the end member 57; and an air nozzle 59. The end member 57 is configured to be vertically movable. An end portion of the end needle-shaped member 58 can be placed at a height of the protective tape affixed to the workpiece by adjusting the height position of the end member 57. In addition, the air nozzle 59 is supplied with a high-pressure air via the fourth air cylinder 51d and the shaft 510d, and is configured to be able to jet the high-pressure air as required.

2 Processing Method

Description will next be made of a method of processing the workpiece having the surface protective tape affixed to the top surface thereof by using the above-described expanding apparatus 1. The workpiece to which the present invention is applied is a workpiece having division starting points (for example, a modified layer) formed along a plurality of intersecting planned dividing lines, and having a surface protective tape affixed to a top surface of the workpiece, or a workpiece divided into individual chips along intersecting planned dividing lines, and having a surface protective tape affixed to a top surface of the workpiece.

(1) Sheet Feeding Step

Figure 4:
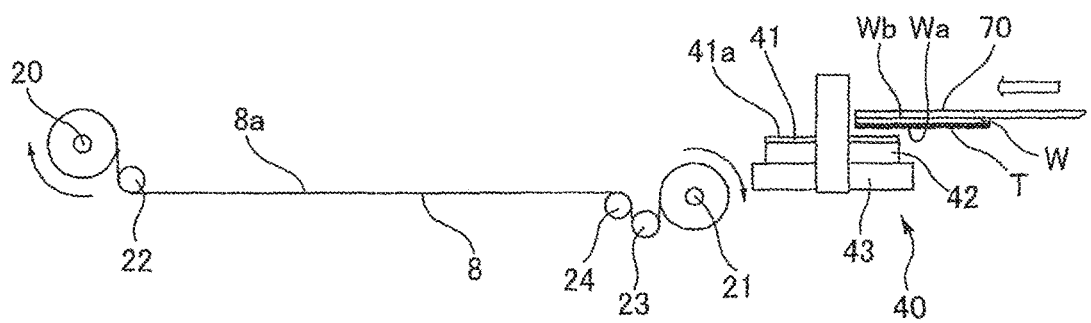
FIG. 4 is a sectional view depicting a sheet feeding step and a workpiece carrying-in step.

As depicted in FIG. 4, the expanding sheet 8 wound in a roll shape is fed in the first direction from the feeding reel 20 on one end side by the feeding roller 22, and the fed expanding sheet 8 is drawn in by the drawing-in rollers 23 and 24, and wound by the winding reel 21. At this time, the upper surface of the fed expanding sheet 8, the upper surface being exposed upward, is an adhesive surface 8a having an adhesion property. Incidentally, a material for the expanding sheet 8 used in the present embodiment is not particularly limited. However, for example, an expanding sheet is used which is formed by laminating an adhesive layer to a base material layer such as polyolefin, polyvinyl chloride, or the like.

(2) Workpiece Carrying-In Step

A wafer W is carried into the holding means 40. The wafer W is an example of the workpiece. The wafer W has devices formed in respective regions demarcated by a plurality of intersecting planned dividing lines in a top surface Wa of the wafer W. A surface protective tape T for protecting the devices is affixed to the top surface Wa of the wafer W. An undersurface on an opposite side from the top surface Wa is an affixing surface Wb to be affixed to the expanding sheet 8 in an affixing step to be described later. The wafer W depicted in the present embodiment has a modified layer inside the wafer W, the modified layer being formed along the planned dividing lines by irradiation with a laser beam, for example. The wafer W is thinned in a grinding apparatus, for example, and is divided into individual chips with the modified layer as a starting point.

The wafer W is carried into the holding means 40 by a robot hand 70, for example. The robot hand 70 holds the affixing surface Wb of the wafer W, and moves to the upward side of the holding means 40. At this time, the holding means 40 preferably waits with the holding surface 41a of the holding table 41 oriented upward. This enables the robot hand 70 to carry the wafer W onto the holding table 41 directly without inverting the wafer W after completion of grinding and cleaning. Therefore, a risk of damage to the wafer W in a state of having been divided into individual chips can be reduced. Incidentally, a worker may directly carry the wafer W onto the holding table 41.

(3) Workpiece Facing Step

Figure 5:
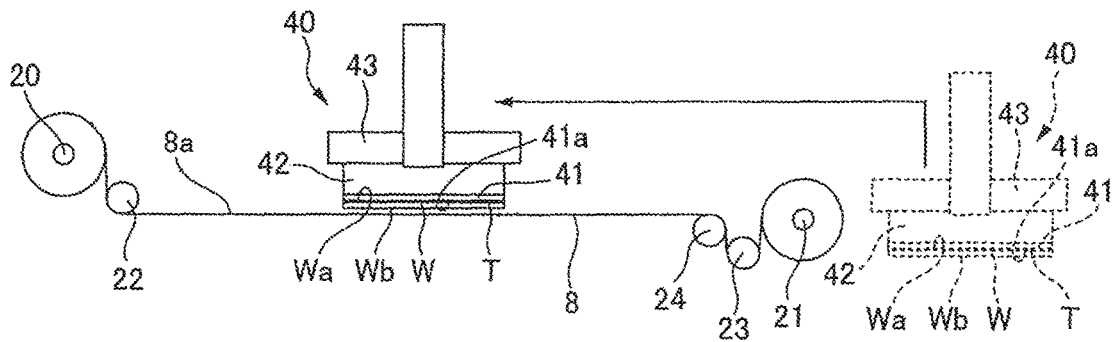
FIG. 5 is a sectional view depicting a workpiece facing step.

As depicted in FIG. 5, the wafer W is held by the holding means 40, and the affixing surface Wb of the wafer W is faced to the adhesive surface 8a of the expanding sheet 8 fed in the sheet feeding step. Specifically, in a state in which the holding surface 41a of the holding table 41 holds the top surface Wa side of the wafer W, the rotary shaft 44 depicted in FIG. 2 rotates to invert the holding surface 41a of the holding table 41 and expose the affixing surface Wb of the wafer W downward. Next, the holding means 40 is moved to a desired position by running of the running portion 401, then positions the affixing surface Wb of the wafer W at a position approximately a few mm above the expanding sheet 8 by lowering the holding table 41 by the raising and lowering portion 400, and faces the affixing surface Wb of the wafer W to the adhesive surface 8a of the expanding sheet 8. Incidentally, the holding means 40 may move to a desired position without inverting the holding table 41, then invert the holding table 41, and position the affixing surface Wb of the wafer W at a position approximately a few mm above the expanding sheet 8.

(4) Sandwiching Step

Figure 6:
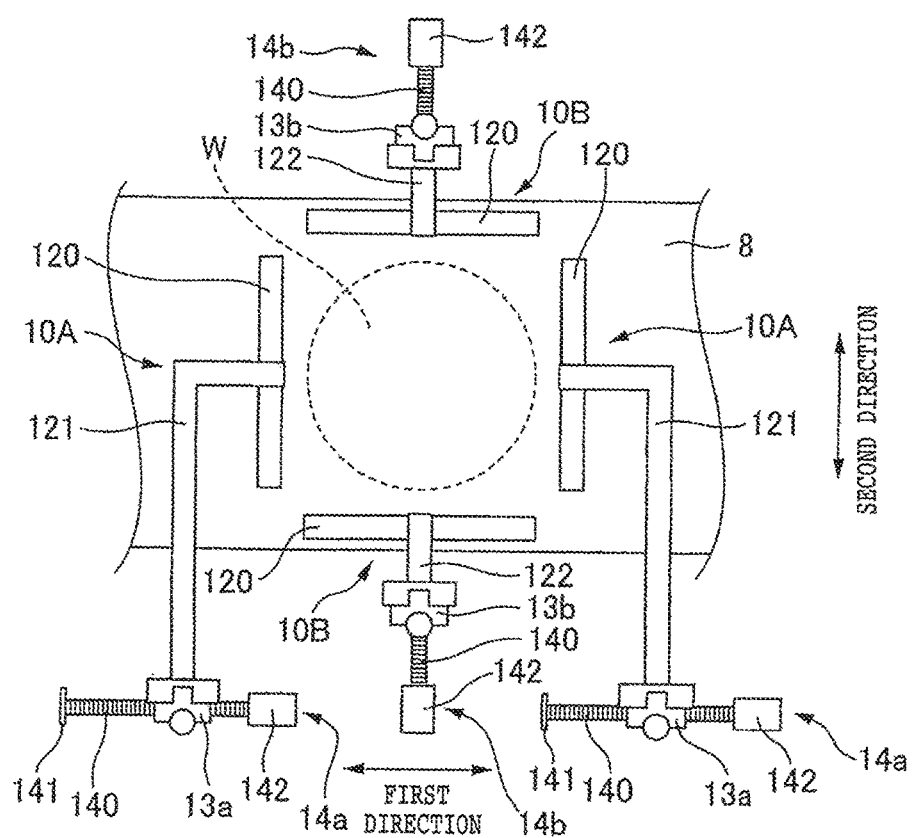
FIG. 6 is a plan view depicting a sandwiching step.

After the workpiece facing step is performed, as depicted in FIG. 6, the expanding sheet 8 is sandwiched by the pair of first sandwiching means 10A opposed to each other with the wafer W interposed therebetween in the first direction, and the expanding sheet 8 is sandwiched by the pair of second sandwiching means 10B opposed to each other with the wafer W interposed therebetween in the second direction orthogonal to the first direction. First, the two first direction moving means 14a are actuated to move the movable bases 13a horizontally in the first direction such that the pair of first sandwiching means 10A approaches each other. In addition, the two second direction moving means 14b are actuated to move the movable bases 13b horizontally in the second direction such that the pair of second sandwiching means 10B approaches each other. The pair of first sandwiching means 10A and the pair of second sandwiching means 10B are thus made to approach each other.

At this time, the expanding sheet 8 extending in the first direction is positioned between each lower side sandwiching portion 110 and each upper side sandwiching portion 120 depicted in FIG. 2 in the pair of first sandwiching means 10A and the pair of second sandwiching means 10B. Next, each lower side sandwiching portion 110 is raised by a raising and lowering mechanism, and each upper side sandwiching portion 120 is lowered by a raising and lowering mechanism. The rollers 113 of the lower side sandwiching portions 110 press the lower surface of the expanding sheet 8, and rollers 123 depicted In FIG. 7 of the upper side sandwiching portion 120 press the upper surface of the expanding sheet 8. The upper and lower surfaces of the expanding sheet 8 are thereby sandwiched.

(5) Advance Expanding Step

Figure 7:
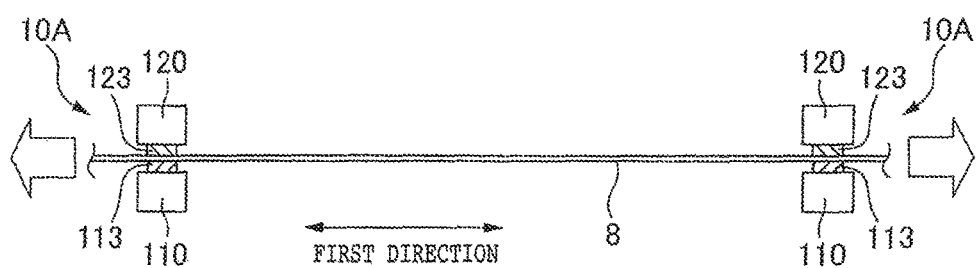
FIG. 7 is a sectional view depicting a preliminary expanding step in a first direction.

When a flexure has occurred in the expanding sheet 8 in the first direction before the affixing step is performed after the sandwiching step is performed, the flexure of the expanding sheet 8 is eliminated by expanding the expanding sheet 8 in the first direction, as depicted in FIG. 7. Specifically, the pair of first sandwiching means 10A is moved so as to be separated from each other in a state in which the pair of first sandwiching means 10A sandwiches the upper and lower surfaces of the expanding sheet 8. That is, the two first direction moving means 14a depicted in FIG. 6 are actuated to move the pair of first sandwiching means 10A horizontally in the first direction such that the pair of first sandwiching means 10A is separated from each other. Thus, the pair of first sandwiching means 10A each pulls the expanding sheet 8 toward the outside, the expanding sheet 8 being sandwiched by the rollers 113 of each lower side sandwiching portion 110 and the rollers 123 of each upper side sandwiching portion 120. As a result, the expanding sheet 8 is expanded in the first direction, and therefore the flexure is eliminated.

Figure 8:
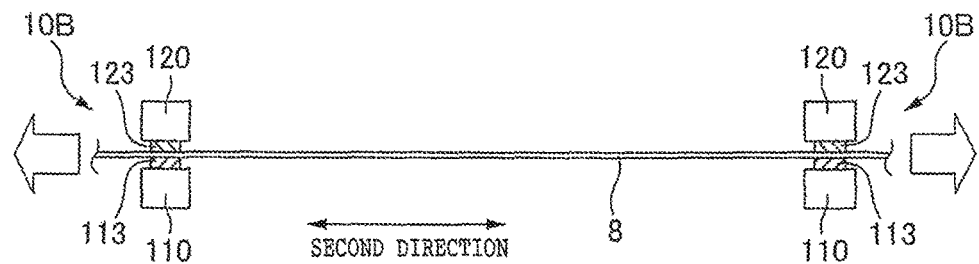
FIG. 8 is a sectional view depicting a preliminary expanding step in a second direction.

Next, when a flexure has occurred in the expanding sheet 8 in the second direction, the flexure of the expanding sheet 8 is eliminated by expanding the expanding sheet 8 in the second direction, as depicted in FIG. 8. The pair of second sandwiching means 10B is moved so as to be separated from each other in a state in which the pair of second sandwiching means 10B sandwiches the upper and lower surfaces of the expanding sheet 8. That is, the two second direction moving means 14b depicted in FIG. 6 are actuated to move the pair of second sandwiching means 10B horizontally in the second direction such that the pair of second sandwiching means 10B is separated from each other. Thus, the pair of second sandwiching means 10B each pulls the expanding sheet 8 toward the outside, the expanding sheet 8 being sandwiched between the rollers 113 of each lower side sandwiching portion 110 and the rollers 123 of each upper side sandwiching portion 120. As a result, the expanding sheet 8 is expanded in the second direction, and therefore the flexure is eliminated.

In the present embodiment, the advance expanding step in the second direction is performed after the advance expanding step in the first direction is performed. However, without being limited to this case, the advance expanding step in the first direction and the advance expanding step in the second direction may be performed simultaneously, or the expanding sheet 8 may be expanded in the first direction after the expanding sheet 8 is expanded in the second direction. An amount of expansion of the expanding sheet 8 in the first direction and an amount of expansion of the expanding sheet 8 in the second direction may be equal to each other, or may be different from each other. Of course, the amount of expansion of the expanding sheet 8 in the first direction and the amount of expansion of the expanding sheet 8 in the second direction are preferably set as appropriate according to degrees of flexure of the expanding sheet 8.

(6) Affixing Step

Figure 9:
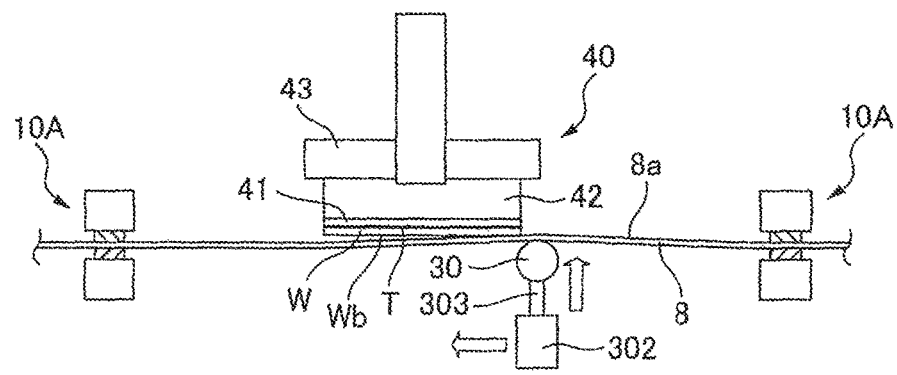
FIG. 9 is a sectional view depicting an affixing step.

After the sandwiching step is performed (after the advance expanding step in the case where the advance expanding step is performed), the undersurface side (affixing surface Wb side) of the wafer W is affixed onto the expanding sheet 8, which has a larger size than the wafer W, as depicted in FIG. 9. Specifically, the affixing roller 30 is brought into contact with the lower surface of the expanding sheet 8 by raising the piston 303 in the air cylinder 302. Next, the lower surface of the expanding sheet 8 is pressed upward while the affixing roller 30 is rotated, and the movable base 373 is moved in the first direction by the first direction feeding means 37 depicted in FIG. 2 to roll the affixing roller 30. As pressing of the rolling affixing roller 30 is performed, the expanding sheet 8 is pressed to the affixing surface Wb of the wafer W, and thereby the adhesive surface 8a of the expanding sheet 8 is affixed to the whole of the affixing surface Wb. Thereafter, the affixing roller 30 is retracted from the expanding sheet 8 by lowering the piston 303 in the air cylinder 302. At this time, the upper and lower surfaces of the expanding sheet 8 are sandwiched by the pair of first sandwiching means 10A and the pair of second sandwiching means 10B depicted in FIG. 8. This state is maintained until completion of a sheet cutting step to be described later.

(7) Workpiece Transferring Step

Figure 10:
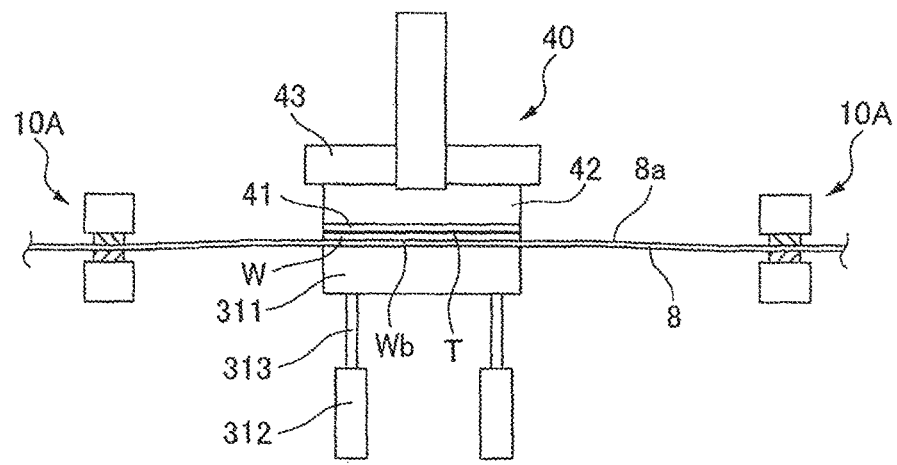
FIG. 10 is a sectional view depicting a workpiece transferring step.

After the affixing step is performed, the wafer W affixed to the expanding sheet 8 is released from the holding means 40, as depicted in FIG. 10. Specifically, the first direction feeding means 37 depicted in FIG. 2 moves the movable base 373 in the first direction, and thus moves the releasing table 311 in the first direction. Next, the pistons 313 are raised in the air cylinders 312, thereby raising the releasing table 311 and positioning the releasing table 311 at a position opposed to the holding means 40. That is, the releasing table 311 comes into contact with the affixing surface Wb side of the wafer W held by the holding table 41 via the expanding sheet 8. Thereafter, the holding table 41 releases the suction of the wafer W, and the releasing table 311 sucks and holds the wafer W. Damage to the wafer W can be reduced by thus transferring the wafer W from the holding table 41 to the releasing table 311.

(8) Preliminary Expanding Step

Figure 11:
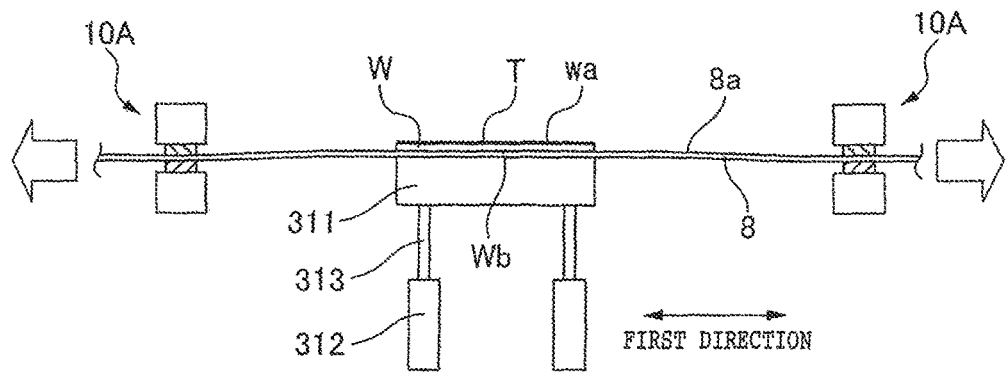
FIG. 11 is a sectional view depicting a preliminary expanding step.

After the affixing step is performed, the expanding sheet 8 is expanded preliminarily, as depicted in FIG. 11. In a state in which the releasing table 311 sucks and holds the wafer W, for example, the two first direction moving means 14a depicted in FIG. 6 are actuated to move the pair of first sandwiching means 10A horizontally in the first direction such that the pair of first sandwiching means 10A is separated from each other. Thus, the pair of first sandwiching means 10A each pulls the expanding sheet 8 toward the outside. In addition, together with the preliminary expansion in the first direction, in the state in which the releasing table 311 sucks and holds the wafer W, the two second direction moving means 14b depicted in FIG. 6 are actuated to move the pair of second sandwiching means 10B horizontally in the second direction such that the pair of second sandwiching means 10B is separated from each other. Thus, the pair of second sandwiching means 10B each pulls the expanding sheet 8 toward the outside. A tension is applied to the expanding sheet 8 stretched by the preliminary expansions in the first direction and the second direction. Therefore, the expanding sheet 8 is securely affixed to the affixing surface Wb of the wafer W, and chips can be prevented from interfering with each other when the surface protective tape T is peeled off the top surface Wa of the wafer W. Incidentally, when the wafer W is not divided into individual chips, the wafer W may be divided into individual chips in the preliminary expanding step. Even in this case, there is no fear of adjacent chips C coming into contact with each other because the expanding sheet 8 is expanded in advance.

(9) Surface Protective Tape Peeling Step

Figure 12:
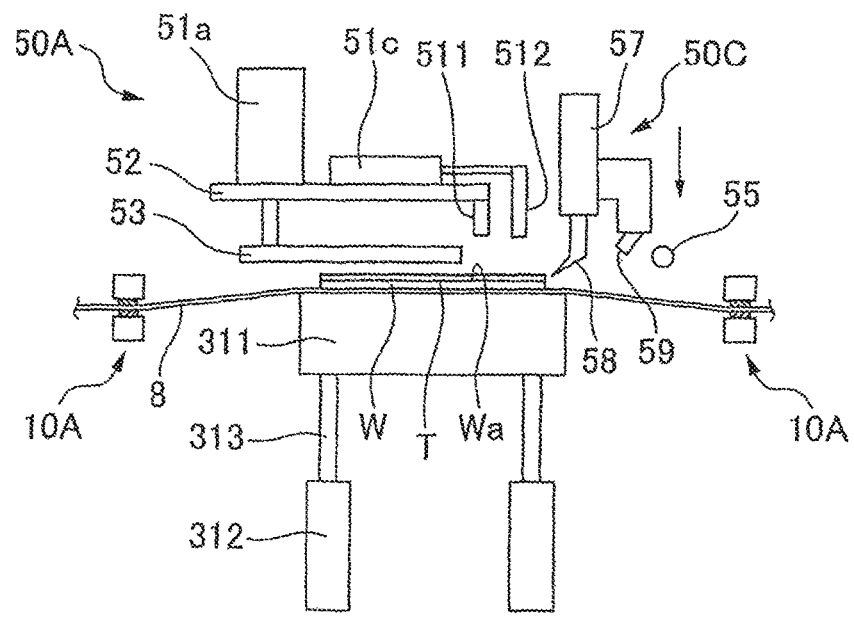
FIG. 12 is a sectional view depicting a state in which an end needle-shaped member is brought into proximity to a workpiece in a surface protective tape peeling step.

In a state in which the expanding sheet 8 is expanded while the preliminary expanding step is performed, the surface protective tape T is peeled off the top surface Wa of the wafer W by using the peeling unit 50 depicted in FIG. 2. First, as depicted in FIG. 12, the tape holding means 50A and the peeling starting point portion forming means 50C are moved to a position above the releasing table 311. At this time, a small outer circumferential part of an outer circumferential edge portion of the surface protective tape T affixed to the wafer W is positioned directly below a point of the end needle-shaped member 58 in the peeling starting point portion forming means 50C. Thereafter, the fourth air cylinder 51d depicted in FIG. 3C is actuated to lower the point of the end needle-shaped member 58 to a position in proximity to the outer circumferential edge portion of the surface protective tape T.

Figure 13:
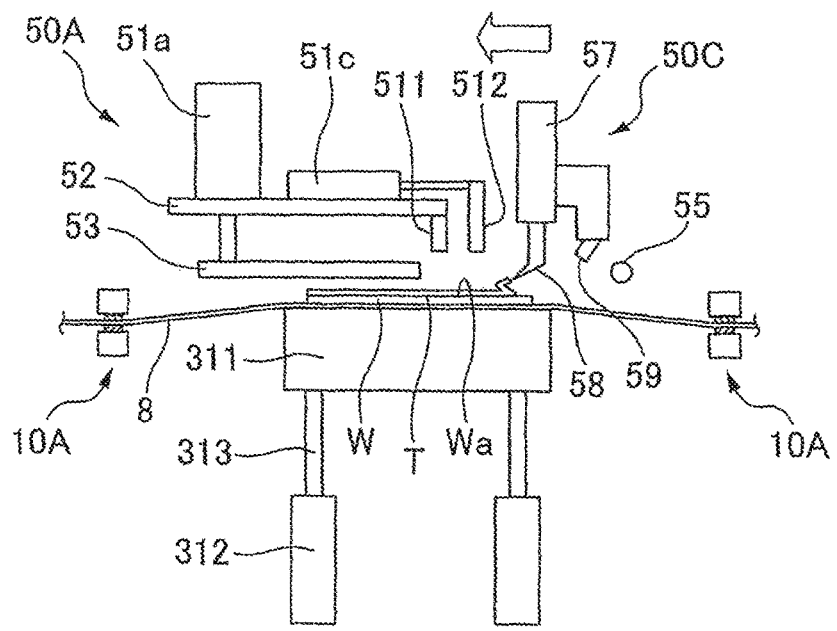
FIG. 13 is a sectional view depicting a state in which the end needle-shaped member is butted against a circumferential edge side of a surface protective tape affixed to the workpiece in the surface protective tape peeling step.

The height of the point of the end needle-shaped member 58 is finely adjusted according to the surface height of the surface protective tape T so that the point of the end needle-shaped member 58 comes in proximity to the outer circumferential part of the surface protective tape T. As depicted in FIG. 13, the point of the end needle-shaped member 58 is butted against the outer circumferential part of the surface protective tape T by slightly moving the tape holding means 50A and the peeling starting point portion forming means 50C leftward in FIG. 12 in a state in which the point is in proximity to the outer circumferential part of the surface protective tape T. Incidentally, while the point of the end needle-shaped member 58 may be butted from the outside in a circumferential direction of the surface protective tape T as depicted in FIG. 13, it is also possible to butt the point of the end needle-shaped member 58 from above the outer circumferential part of the surface protective tape T.

After the point of the end needle-shaped member 58 abuts against the outer circumferential part of the surface protective tape T, the fourth air cylinder 51d is actuated to raise the end needle-shaped member 58 slightly. A part of the outer circumferential part of the surface protective tape T is thereby peeled off excellently.

Figure 14:
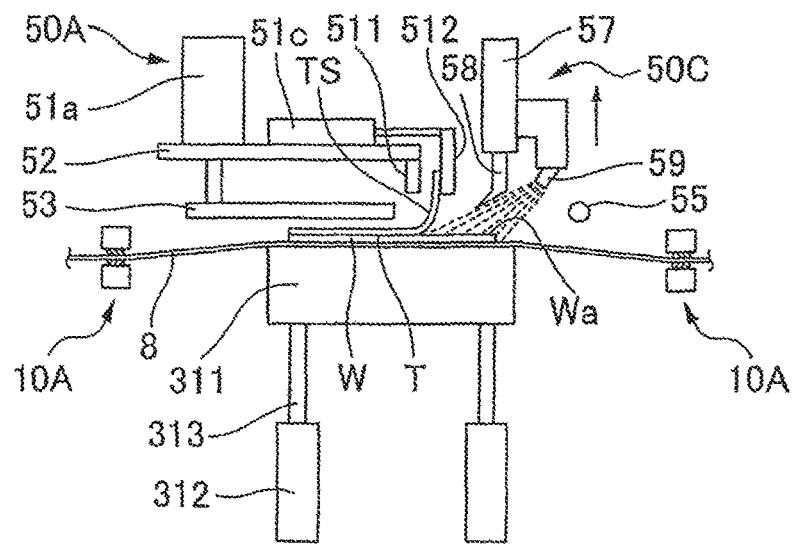
FIG. 14 is a sectional view depicting a state in which a high-pressure air is jetted from an air nozzle toward a part where the surface protective tape is peeled off the workpiece in the surface protective tape peeling step.

After a part of the surface protective tape T is peeled off, the end member 57 is raised, and a high-pressure air is jetted from the air nozzle 59, as depicted in FIG. 14. Thus, the outer circumferential part of the surface protective tape T is separated from the point of the end needle-shaped member 58, a peeled-off region including the part peeled off previously in the outer circumferential part of the surface protective tape T is enlarged, and a peeling starting point portion TS suitable for being sandwiched by the tape holding means 50A is generated. Incidentally, the height of the holding base 52 in the peeling starting point portion forming step is adjusted such that the peeling starting point portion TS is housed between the sandwiching pieces 511 and 512 provided to the holding base 52 when the peeling starting point portion TS is peeled off by the high-pressure air from the air nozzle 59. Incidentally, the above-described end needle-shaped member 58 may be further butted when the peeled-off region is enlarged by jetting the high-pressure air by the air nozzle 59. The peeling starting point portion TS is thus generated suitably.

Figure 15:
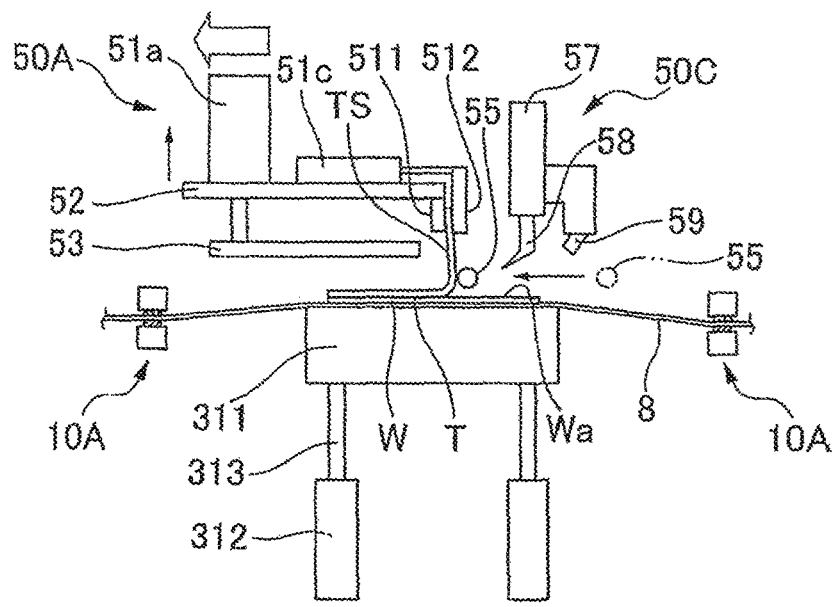
FIG. 15 is a sectional view depicting a state in which a bending roller is moved and brought into contact with the surface protective tape in the surface protective tape peeling step.

After the outer circumferential part of the surface protective tape T is lifted by the high-pressure air jetted from the air nozzle 59, the sandwiching piece 512 is moved to the sandwiching piece 511 side by actuating the third air cylinder 51c, and the peeled-off outer circumferential part of the surface protective tape T is sandwiched by the sandwiching piece 511 and the sandwiching piece 512, as depicted in FIG. 15. Then, the whole of the tape holding means 50A is moved upward by actuating the first air cylinder 51a to such a degree that the bending roller 55 can be advanced to a position below the sandwiching pieces 511 and 512.

The tape holding means 50A is moved upward, and the bending roller 55 is moved to the tape holding means 50A side. Incidentally, the bending roller 55 proceeds with peeling while abutting against the adhesive surface side of the surface protective tape T, the adhesive surface side adhering to the wafer W. Therefore, the bending roller 55 is rotatable about an axial center in a longitudinal direction, and the surface of the bending roller 55 is coated with a fluorocarbon resin so that the adhesive surface of the surface protective tape T with which adhesive surface the bending roller 55 is in contact does not adhere to the bending roller 55. In the present embodiment, the wafer W is ground and formed into the shape of a very thin plate. A small bending angle of the surface protective tape T may cause cracking, fracture, or the like of the wafer W at the time of peeling off the surface protective tape T. The surface protective tape T is preferably bent at an angle of 180 degrees if possible, or an angle close to 180 degrees.

Figure 16:
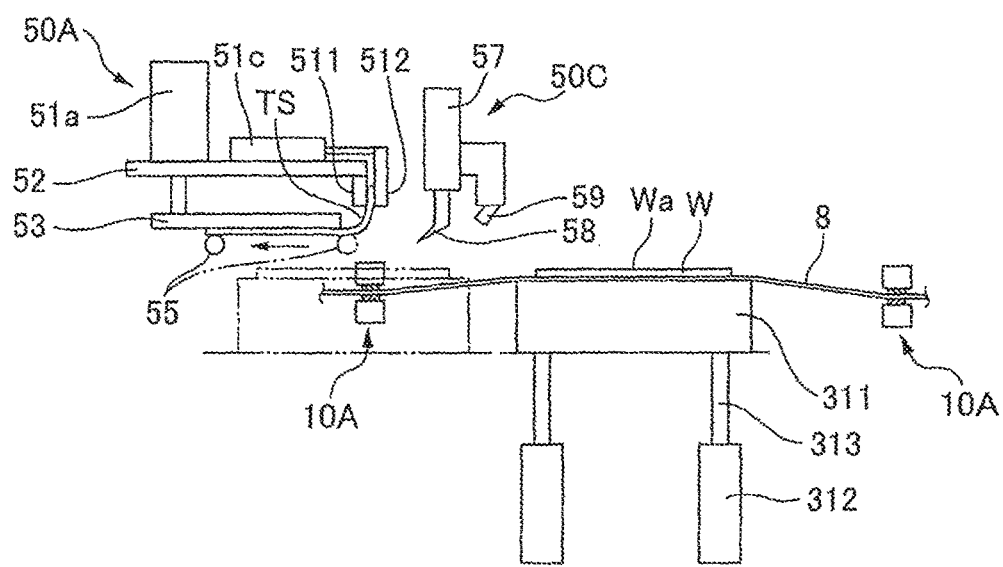
FIG. 16 is a sectional view depicting a state in which the surface protective tape is completely peeled off the workpiece, and the surface protective tape is sucked and held by the lower surface of a holding plate in the surface protective tape peeling step.

As depicted in FIG. 16, when the bending roller 55 is moved to another end portion on a leftward side in FIG. 16 in the lower surface of the holding plate 53, the surface protective tape T is completely peeled off the top surface Wa of the wafer W. The surface protective tape T peeled off the top surface Wa of the wafer W is sucked and held by the holding plate 53. Then, the sandwiching piece 512 is separated from the sandwiching piece 511 by actuating the third air cylinder 51c, so that the outer circumferential part of the surface protective tape T is released. The surface protective tape T is discarded into a waste container, for example.

Figure 17:
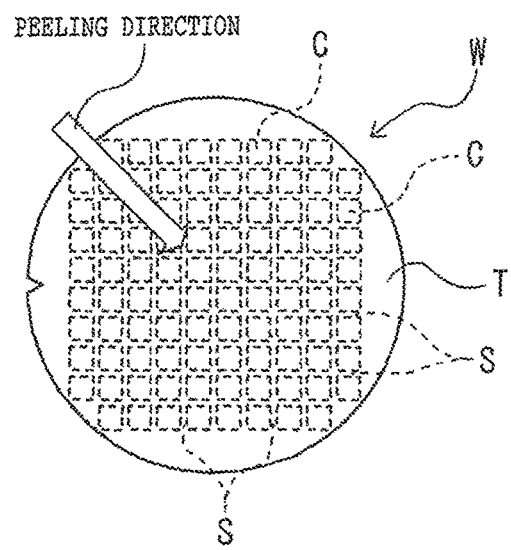
FIG. 17 is a plan view of assistance in explaining a peeling direction of the surface protective tape in the surface protective tape peeling step.

In the surface protective tape peeling step, as depicted in FIG. 17, a peeling direction of peeling off the surface protective tape T is preferably set in a direction different from the extending direction of planned dividing lines S represented by dotted lines. The direction different from the extending direction of the planned dividing lines S means a direction not orthogonal to the extending direction of the planned dividing lines S in the form of a lattice. In the example depicted in FIG. 17, as viewed in plan, an oblique direction indicated by an arrow in FIG. 17 with respect to the extending direction of the planned dividing lines S in the form of a lattice is set as the peeling direction.

When the above-described peeling unit 50 peels off the surface protective tape T affixed to the wafer W, the releasing table 311 depicted in FIG. 16, for example, is rotated so that a position for butting the end needle-shaped member 58 is positioned on the outside in the circumferential direction of the surface protective tape T in the set peeling direction depicted in FIG. 17. Peeling operation similar to that described above is thereafter performed. Specifically, the end needle-shaped member 58 is butted from the peeling direction, the peeling starting point portion TS is formed, and then the bending roller 55 depicted in FIG. 16 is moved to the other end portion on the leftward side in FIG. 16 in the lower surface of the holding plate 53 while the tape holding means 50A sandwiches the outer circumferential part of the surface protective tape T. The surface protective tape T is thereby completely peeled off the top surface Wa of the wafer W. At this time, no large force is applied in the extending direction of the planned dividing lines S. Therefore, adjacent chips C can be prevented from coming into contact with each other when the surface protective tape T is peeled off the top surface Wa of the wafer W. The surface protective tape peeling step is thus completed.

(10) Expanding Step

Figure 18:
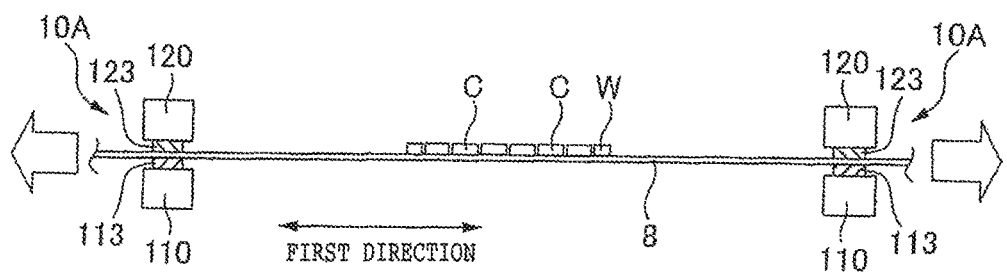
FIG. 18 is a sectional view depicting an expanding step in the first direction.

After the surface protective tape peeling step is performed, intervals are formed between individual chips C by further expanding the expanding sheet 8 in the first direction, as depicted in FIG. 18. Specifically, the two first direction moving means 14a depicted in FIG. 6 are actuated for an amount of expansion which amount is a value larger than an amount of expansion of the expanding sheet 8 in the preliminary expanding step to move the pair of first sandwiching means 10A horizontally in the first direction such that the pair of first sandwiching means 10A is separated from each other. Thus, the pair of first sandwiching means 10A each pulls the expanding sheet 8 to the outside. As the expanding sheet 8 is further expanded, intervals between adjacent chips C are increased, and sufficient intervals can be formed between the chips C. Thus, adjacent chips C can be prevented from coming into contact with each other when the wafer W is transported.

Figure 19:
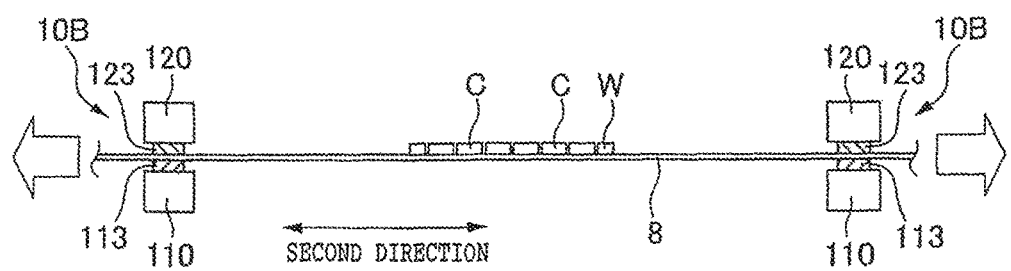
FIG. 19 is a sectional view depicting an expanding step in the second direction.

Next, as depicted in FIG. 19, the expanding sheet 8 is further expanded in the second direction to form intervals between the individual chips C. Specifically, the two second direction moving means 14b depicted in FIG. 6 are actuated for an amount of expansion which amount is a value larger than an amount of expansion of the expanding sheet 8 in the preliminary expanding step to move the pair of second sandwiching means 10B in the second direction such that the pair of second sandwiching means 10B is separated from each other. Thus, the pair of second sandwiching means 10B each pulls the expanding sheet 8 to the outside. As the expanding sheet 8 is further expanded, intervals between adjacent chips C are widened, and sufficient intervals can be formed between the chips C. Thus, as in the expanding step in the first direction, adjacent chips C can be prevented from coming into contact with each other when the wafer W is transported. Incidentally, in the present embodiment, the expanding step in the second direction is performed after the expanding step in the first direction is performed. However, without being limited to this case, the expanding step in the first direction and the expanding step in the second direction may be performed simultaneously, or the expansion in the first direction may be performed after the expansion in the second direction. In addition, the amount of expansion of the expanding sheet 8 in the first direction and the amount of expansion of the expanding sheet 8 in the second direction may be equal to each other, or may be different from each other.

(11) Undivided Region Dividing Step

Here, when there is an undivided region not divided into individual chips C (region not divided with the modified layer as a starting point) in the wafer W expanded in the first direction expanding step and the second direction expanding step, the undivided region is divided into individual chips C by applying an external force to the wafer W by the dividing means 35 depicted in FIG. 2. For example, when the wafer W has an undivided region in the first direction, the extending direction of the squeegee 350 is adjusted to the first direction by rotating the rotary table 36, and the squeegee 350 is positioned at a position corresponding to the undivided region by moving the movable base 383 in the second direction by the second direction feeding means 38. Next, the squeegee 350 is raised and brought into contact with the wafer W via the expanding sheet 8, and the wafer W is sucked through the slit 351. The undivided region is thereby divided into Individual chips C. Incidentally, the undivided region dividing step is performed at least before a frame affixing step.

(12) Frame Positioning Step

Figure 20:
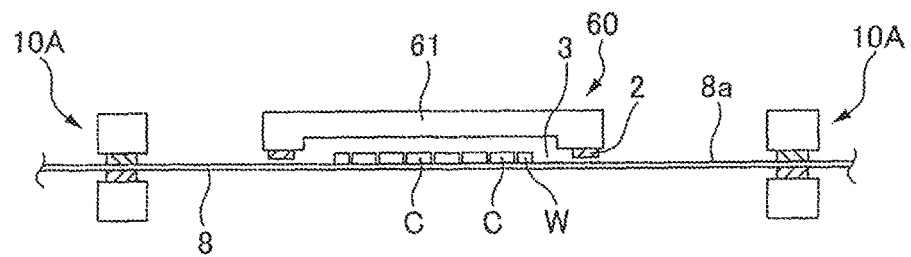
FIG. 20 is a sectional view depicting a frame positioning step.

After the first direction expanding step and the second direction expanding step are performed, the frame holding means 60 faces an annular frame 2 to the expanding sheet 8, as depicted in FIG. 20. First, the frame holding means 60 sucks and holds an annular frame 2 housed in the frame stocker 5 depicted in FIG. 2 by the frame holding portion 61, carries out the annular frame 2, and moves the annular frame 2 to the upward side of the expanding sheet 8. Next, in a state in which the pair of first sandwiching means 10A and the pair of second sandwiching means 10B depicted in FIG. 19 sandwich the expanding sheet 8, the annular frame 2 is faced to the adhesive surface 8a of the expanding sheet 8, and the wafer W is positioned on the inside of the opening 3 of the annular frame 2.

(13) Frame Affixing Step

Figure 21:
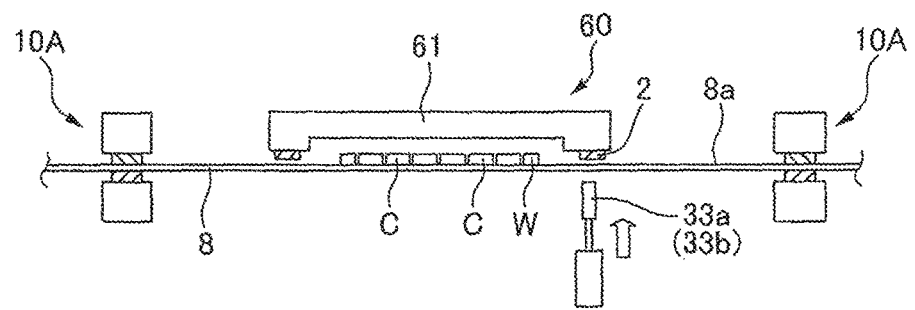
FIG. 21 is a sectional view depicting a frame affixing step.

After the frame positioning step is performed, the expanding sheet 8 is affixed to the annular frame 2 positioned so as to face the adhesive surface 8a of the expanding sheet 8, as depicted in FIG. 21. Specifically, the frame affixing rollers 33a and 33b are raised by the raising and lowering mechanism, so that the frame affixing rollers 33a and 33b are brought into contact with the lower surface of the expanding sheet 8. Next, the frame affixing rollers 33a and 33b press the lower surface of the expanding sheet 8 upward while the frame affixing rollers 33a and 33b are rolled along the annular frame 2 by at least one rotation of the rotary table 36 depicted in FIG. 2. The adhesive surface 8a of the expanding sheet 8 is thereby affixed to the annular frame 2. After the expanding sheet 8 is affixed to the annular frame 2, the frame affixing rollers 33a and 33b are lowered and retracted from the expanding sheet 8.

(14) Sheet Cutting Step

Figure 22:
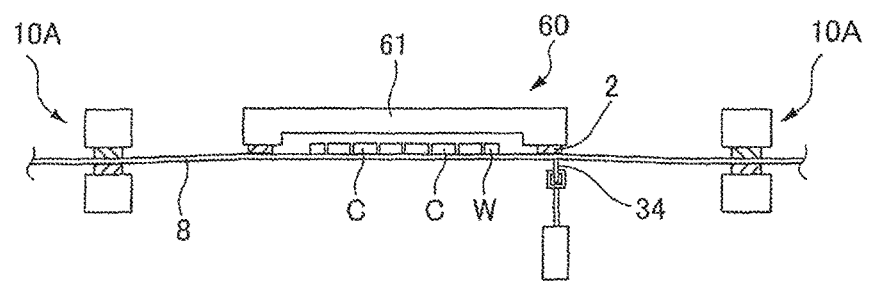
FIG. 22 is a sectional view depicting a sheet cutting step.

After the frame affixing step is performed, the expanding sheet 8 is cut along the annular frame 2, as depicted in FIG. 22. Specifically, the cutting means 34 is raised and cut into the expanding sheet 8 by the raising and lowering mechanism. The cutting means 34 is moved circularly along the annular frame 2 by at least one rotation of the rotary table 36 depicted in FIG. 2. The expanding sheet 8 is thereby cut.

(15) Carrying-Out Step

Figure 23:
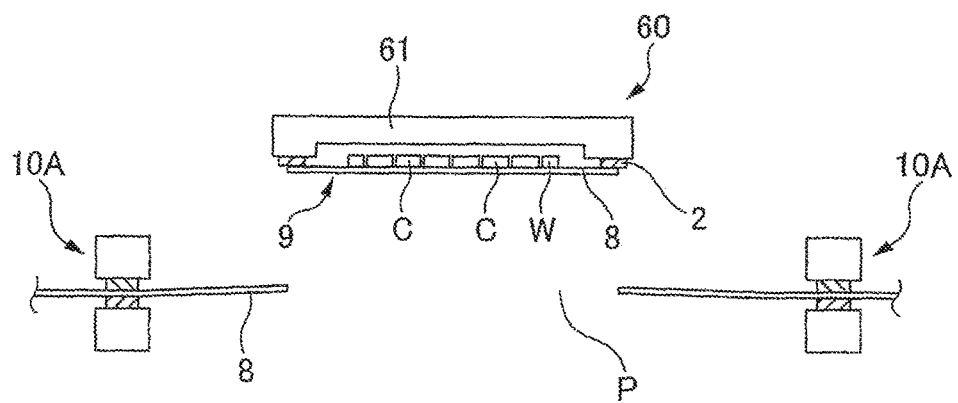
FIG. 23 is a sectional view depicting a carrying-out step.

After the sheet cutting step is performed, a frame unit 9 is formed in which the wafer W is affixed to the annular frame 2 via the expanding sheet 8, as depicted in FIG. 23. Then, the frame holding means 60 is raised in a state of holding the frame unit 9. The frame holding means 60 thereby carries out the frame unit 9 from a position P where the expanding sheet 8 is cut, and transports the frame unit 9 for a next step (for example, a mounting step).

Thus, in the processing method according to the present invention, the surface protective tape peeling step of peeling the surface protective tape T off the top surface Wa of the wafer W is performed in a state in which the expanding sheet 8 is expanded while the preliminary expanding step of expanding the expanding sheet 8 is performed after the affixing step is performed. Therefore, the surface protective tape T can be peeled off the top surface Wa of the wafer W while a tension is applied to the expanding sheet 8. It is thereby possible to prevent chips from coming into contact with each other and being damaged. Thereafter, the processing proceeds to the expanding step, in which the expanding sheet 8 is expanded by an amount of expansion which amount is a value larger than an amount of expansion of the expanding sheet 8 in the preliminary expanding step. Thus, sufficient intervals can be formed between the chips C, and the chips C can be transported smoothly.

In addition, in the present invention, the sandwiching step is performed to sandwich the expanding sheet 8 by the pair of first sandwiching means 10A opposed to each other with the wafer W interposed therebetween in the first direction, and sandwich the expanding sheet 8 by the pair of second sandwiching means 10B opposed to each other with the wafer W interposed therebetween in the second direction orthogonal to the first direction. In the preliminary expanding step and the expanding step, the expanding sheet 8 is expanded by moving the pair of first sandwiching means 10A horizontally in the first direction such that the pair of first sandwiching means 10A is separated from each other, and moving the pair of second sandwiching means 10B horizontally in the second direction such that the pair of second sandwiching means 10B is separated from each other. The expanding sheet 8 can therefore be expanded sufficiently.

Further, in the present invention, when the surface protective tape peeling step is performed, the peeling direction of peeling off the surface protective tape T is set to be a direction different from the extending direction of the planned dividing lines S. Thus, a force at the time of peeling the surface protective tape T off the top surface Wa of the wafer W does not greatly act in the extending direction of the planned dividing lines S. Thus, the surface protective tape T can be peeled off efficiently, and the chips can be prevented from coming into contact with each other and being damaged.

In the present embodiment, description has been made of a case where the pair of first sandwiching means 10A and the pair of second sandwiching means 10B of the expanding apparatus 1 expand the expanding sheet 8 in the first direction and the second direction while sandwiching four sides of the expanding sheet 8. However, there is no limitation to this case. The above-described advance expanding step, the above-described preliminary expanding step, and the above-described expanding step may be performed by using a drum type expanding apparatus disclosed in Japanese Patent Laid-Open No. 2007-123658, for example.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece processing method of processing a workpiece having division starting points formed within the workpiece along a plurality of intersecting planned dividing lines, and having a surface protective tape affixed to a top surface of the workpiece, or a workpiece divided into individual chips along a plurality of intersecting planned dividing lines, and having a surface protective tape affixed to a top surface of the workpiece, the workpiece processing method comprising:

an affixing step of affixing an undersurface side of the workpiece onto an expanding sheet having a larger size than the workpiece;

a preliminary expanding step of expanding the expanding sheet after performing the affixing step;

a surface protective tape peeling step of peeling the surface protective tape off the top surface of the workpiece in a state in which the expanding sheet is expanded while the preliminary expanding step is performed; and an expanding step of expanding the expanding sheet by an amount of expansion, the amount of expansion being a value larger than an amount of expansion of the expanding sheet in the preliminary expanding step, after performing the surface protective tape peeling step.

2. The workpiece processing method according to claim 1, further comprising:

a sandwiching step of sandwiching the expanding sheet by a pair of first sandwiching means opposed to each other with the workpiece interposed between the pair of the first sandwiching means in a first direction and sandwiching the expanding sheet by a pair of second sandwiching means opposed to each other with the workpiece interposed between the pair of the second sandwiching means in a second direction orthogonal to the first direction, wherein the preliminary expanding step and the expanding step expand the expanding sheet by moving the pair of the first sandwiching means such that the pair of the first sandwiching means is separated from each other, and moving the pair of the second sandwiching means such that the pair of the second sandwiching means is separated from each other.

3. The workpiece processing method according to claim 1, wherein in the surface protective tape peeling step, a peeling direction of peeling off the surface protective tape is set to be a direction different from an extending direction of the planned dividing lines.

* * * * *